(12) United States Patent
Zacchera et al.

(10) Patent No.: US 10,465,607 B2
(45) Date of Patent: Nov. 5, 2019

(54) METHOD OF MANUFACTURING CONDUCTIVE FILM HOLES

(71) Applicant: United Technologies Corporation, Farmington, CT (US)

(72) Inventors: Kevin L. Zacchera, Glastonbury, CT (US); Thomas N. Slavens, Norman, OK (US)

(73) Assignee: United Technologies Corporation, Farmington, CT (US)

( * ) Notice: Subject to any disclaimer, the term of this patent is extended or adjusted under 35 U.S.C. 154(b) by 162 days.

(21) Appl. No.: 15/479,747

(22) Filed: Apr. 5, 2017

(65) Prior Publication Data
US 2018/0291811 A1    Oct. 11, 2018

(51) Int. Cl.
| | |
|---|---|
| *F23R 3/00* | (2006.01) |
| *F02C 7/18* | (2006.01) |
| *C23C 14/04* | (2006.01) |
| *F01D 5/18* | (2006.01) |
| *F01D 5/28* | (2006.01) |
| *C23C 4/01* | (2016.01) |

(52) U.S. Cl.
CPC .................. *F02C 7/18* (2013.01); *C23C 4/01* (2016.01); *C23C 14/042* (2013.01); *F01D 5/186* (2013.01); *F01D 5/288* (2013.01); *F23R 3/002* (2013.01); *B23P 2700/06* (2013.01); *F05D 2220/32* (2013.01); *F05D 2230/237* (2013.01); *F05D 2230/40* (2013.01); *F05D 2230/90* (2013.01); *F05D 2240/35* (2013.01); *F05D 2260/202* (2013.01); *F05D 2300/175* (2013.01); *F05D 2300/20* (2013.01); *F23R 2900/00018* (2013.01)

(58) Field of Classification Search
CPC ............. F05D 2230/90; F05D 2230/40; B23P 2700/13; B23P 2700/06; F23R 2900/00018
See application file for complete search history.

(56) References Cited

U.S. PATENT DOCUMENTS

| | | | |
|---|---|---|---|
| 5,626,462 A | 5/1997 | Jackson et al. | |
| 5,640,767 A * | 6/1997 | Jackson | B23P 15/04 |
| | | | 118/427 |

(Continued)

FOREIGN PATENT DOCUMENTS

| | | |
|---|---|---|
| EP | 0951579 B1 | 1/2003 |
| EP | 2586983 A2 | 5/2013 |

(Continued)

OTHER PUBLICATIONS

Gold Braze 8020, retrieved from internet https://princeizant.com/product/gold-braze-8020, Mar. 1, 2017, The Prince & Izant Companies, Cleveland, Ohio.

(Continued)

*Primary Examiner* — Christopher J Besler
(74) *Attorney, Agent, or Firm* — Bachman & LaPointe, P.C.

(57) ABSTRACT

A method for applying a coating to a substrate having a plurality of holes. The method comprises: applying a braze material to a substrate having a plurality of holes; heating the substrate to melt the braze material to form a melt; cooling the substrate to solidify the melt to form plugs in the respective holes; applying a coating to the substrate; and further heating the substrate to melt the plugs.

12 Claims, 3 Drawing Sheets

(56) References Cited

U.S. PATENT DOCUMENTS

| | | | |
|---|---|---|---|
| 6,265,022 | B1 | 7/2001 | Fernihough et al. |
| 6,383,602 | B1 | 5/2002 | Fric et al. |
| 7,093,439 | B2 | 8/2006 | Pacheco-Tougas et al. |
| 7,772,314 | B2 | 8/2010 | Fernihough et al. |
| 8,739,404 | B2 | 6/2014 | Bunker et al. |
| 2007/0036942 | A1* | 2/2007 | Steele .................... F01D 25/12 |
| | | | 428/131 |
| 2010/0288823 | A1 | 11/2010 | Ladru et al. |
| 2012/0124832 | A1* | 5/2012 | Bunker .................. F01D 5/147 |
| | | | 29/888 |
| 2012/0167573 | A1 | 7/2012 | Belousov et al. |
| 2014/0220324 | A1* | 8/2014 | Strock ..................... F02C 7/24 |
| | | | 428/212 |

FOREIGN PATENT DOCUMENTS

| | | |
|---|---|---|
| EP | 2662469 A2 | 11/2013 |
| WO | 2009087189 A2 | 7/2009 |

OTHER PUBLICATIONS

Product Sheet "Braz-Binder Gel", Sep. 5, 2014, HTK Hamburg GmbH, Hamburg, Germany.
European Search Report dated Jun. 13, 2018 for EP Patent Application No. 18165714.9.

* cited by examiner

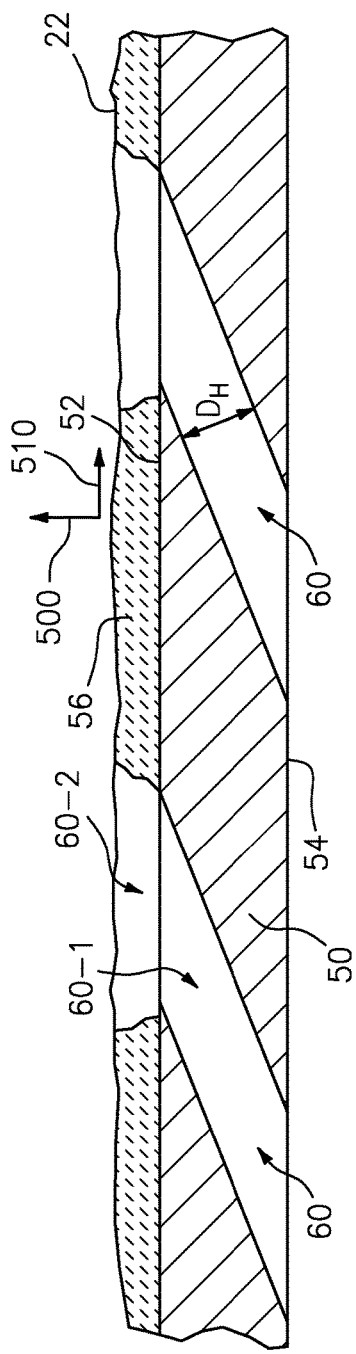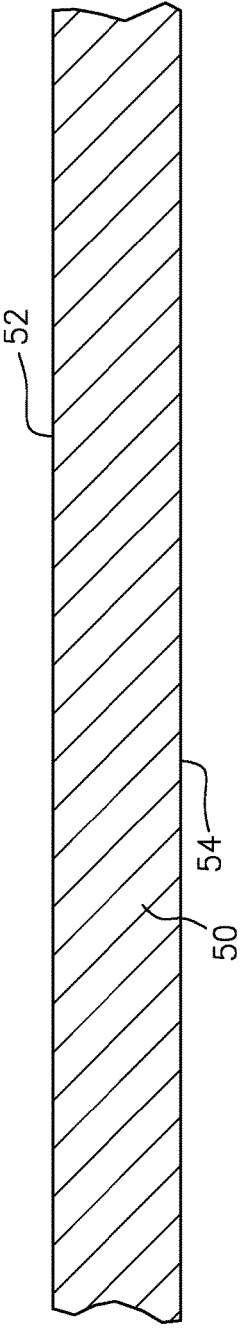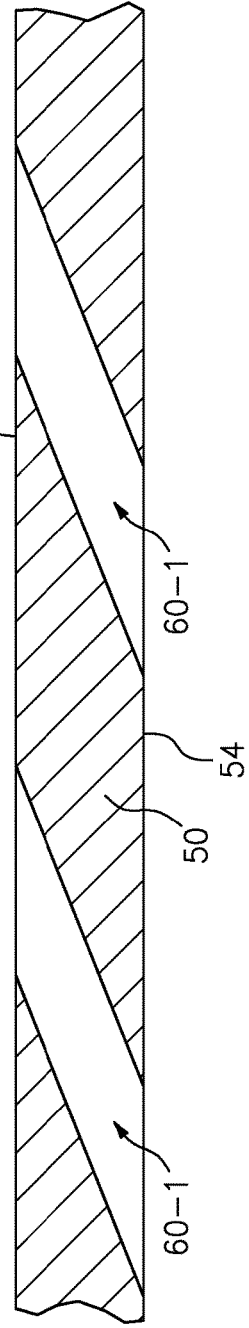

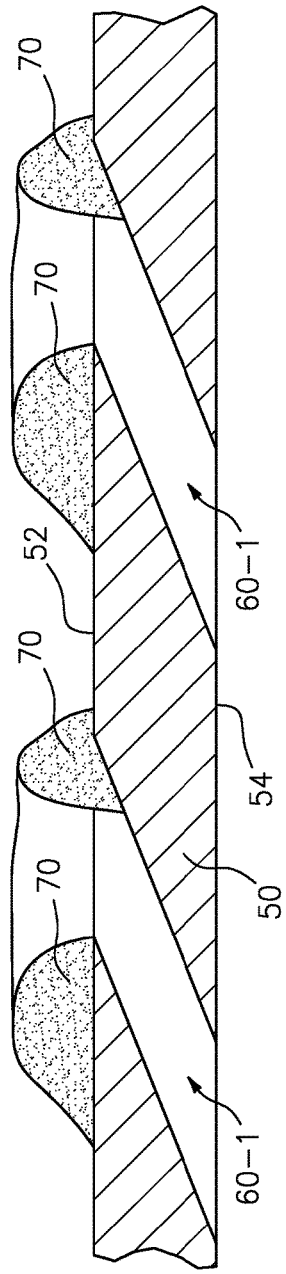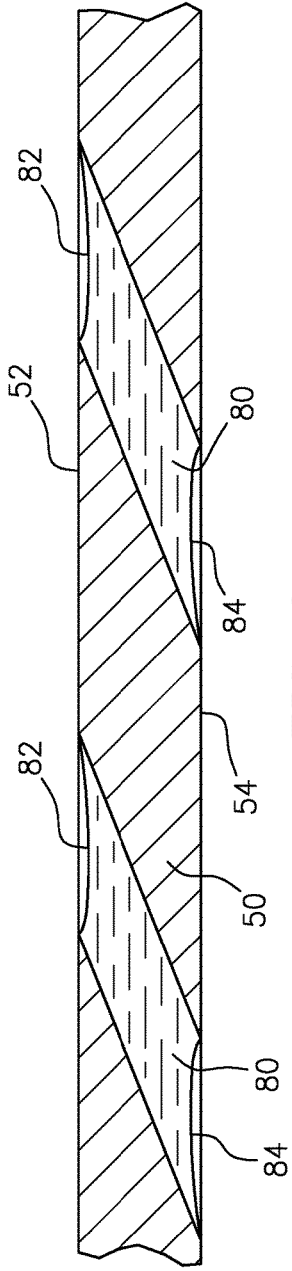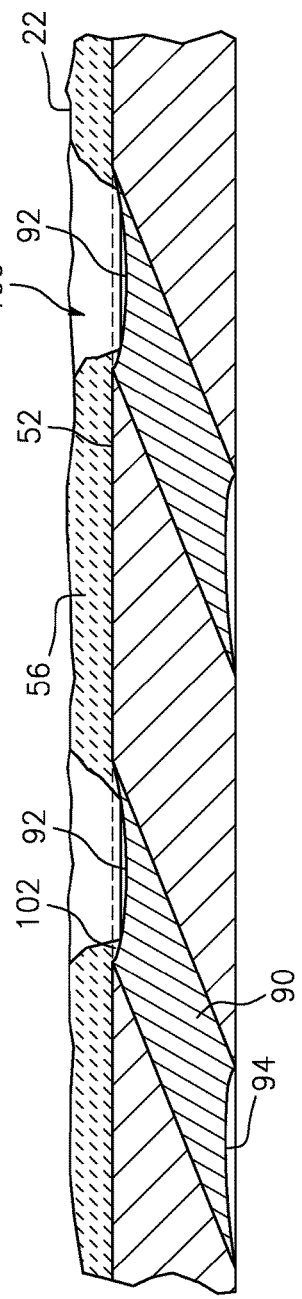

METHOD OF MANUFACTURING CONDUCTIVE FILM HOLES

BACKGROUND

The disclosure relates to aerospace coatings for metallic substrates. More particularly, the disclosure relates to application of coatings to parts having cooling holes.

A variety of metallic parts used in gas turbine engines have fine cooling holes. Typical cooled parts comprise nickel-based or cobalt-based superalloys. Typical parts are formed by casting and they include: combustor panels; blades, vanes, or other airfoil members; blade outer airseals (BOAS); and the like. A typical such component is formed by a combination of casting and machining. Cooling holes may be formed post-casting (e.g., via mechanical machining, electro-discharge machining, laser machining, or the like) or may be cast in place such as via refractory metal cores.

The components often comprise a thermal barrier coating (TBC) system comprising one or more ceramic layers. One or more bondcoat or other layers may intervene between the ceramic layer(s) and the substrate. When the holes preexist coating application, the possibility exists of the coating plugging the holes (fully or partially). Even if the coating does not plug the holes, coating may deposit along the interior surfaces of the holes. Coated surfaces may reduce heat transfer along the holes.

Exemplary combustor panels and coatings are disclosed in U.S. Patent Application Publication No. 2012/0167573A1, Jul. 5, 2012, and U.S. Pat. No. 7,093,439, Aug. 22, 2006, the disclosures of which are incorporated by reference herein in their entireties as if set forth at length.

SUMMARY

One aspect of the disclosure involves a method for applying a coating to a substrate having a plurality of holes. The method comprises: applying a braze material to a substrate having a plurality of holes; heating the substrate to melt the braze material to form a melt; cooling the substrate to solidify the melt to form plugs in the respective holes; applying a coating to the substrate; and further heating the substrate to melt the plugs.

A further embodiment may additionally and/or alternatively include the applying the coating comprising: applying a metallic bondcoat; and applying a ceramic coating atop the bondcoat.

A further embodiment may additionally and/or alternatively include the applying the braze paste comprising applying the braze material to portions of a surface of the substrate aside the hole but not plugging the holes.

A further embodiment may additionally and/or alternatively include the braze material being an Au—Cu braze material.

A further embodiment may additionally and/or alternatively include the braze material being unreactive to the substrate.

A further embodiment may additionally and/or alternatively include the braze material being applied via a braze paste.

A further embodiment may additionally and/or alternatively include the braze paste comprising a water-based gel binder.

A further embodiment may additionally and/or alternatively include the braze paste comprising particles of an alloy having a by weight composition of Au, Cu, and no more than 5% all other elements total, if any.

A further embodiment may additionally and/or alternatively include a ratio of Au to Cu in said alloy being between 67/33 and 56/44.

A further embodiment may additionally and/or alternatively include said particles of said alloy forming at least 95% of alloy in the braze paste.

A further embodiment may additionally and/or alternatively include said water-based gel binder forming 8% to 25% by weight of the braze paste.

A further embodiment may additionally and/or alternatively include machining the holes.

A further embodiment may additionally and/or alternatively include using pressurized gas to evacuate molten material of the plugs.

A further embodiment may additionally and/or alternatively include vibrating to evacuate molten material of the plugs.

A further embodiment may additionally and/or alternatively include, during the applying, the coating preferentially depositing away from the plugs.

A further embodiment may additionally and/or alternatively include the coating comprising a ceramic layer.

A further embodiment may additionally and/or alternatively include the substrate being a nickel-based superalloy.

A further embodiment may additionally and/or alternatively include the substrate being a combustor panel substrate having a body formed as a frustoconical segment.

A further embodiment may additionally and/or alternatively include the holes being along the body.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 2 is a partial sectional view of a body of the panel through cooling holes and taken along line 2-2 of FIG.

FIG. 3 is a view of a substrate of the panel body prior to hole formation and corresponding to the cut plane of FIG. 2.

FIG. 4 is a view of the substrate after to hole formation and corresponding to the cut plane of FIG. 2.

FIG. 5 is a view of the substrate after application of braze material and corresponding to the cut plane of FIG. 2.

FIG. 6 is a view of the substrate upon melting of the braze material and corresponding to the cut plane of FIG. 2.

FIG. 7 is a view of the substrate after solidification of the braze material and application of a coating and corresponding to the cut plane of FIG. 2.

Like reference numbers and designations in the various drawings indicate like elements.

DETAILED DESCRIPTION

Figure 1:
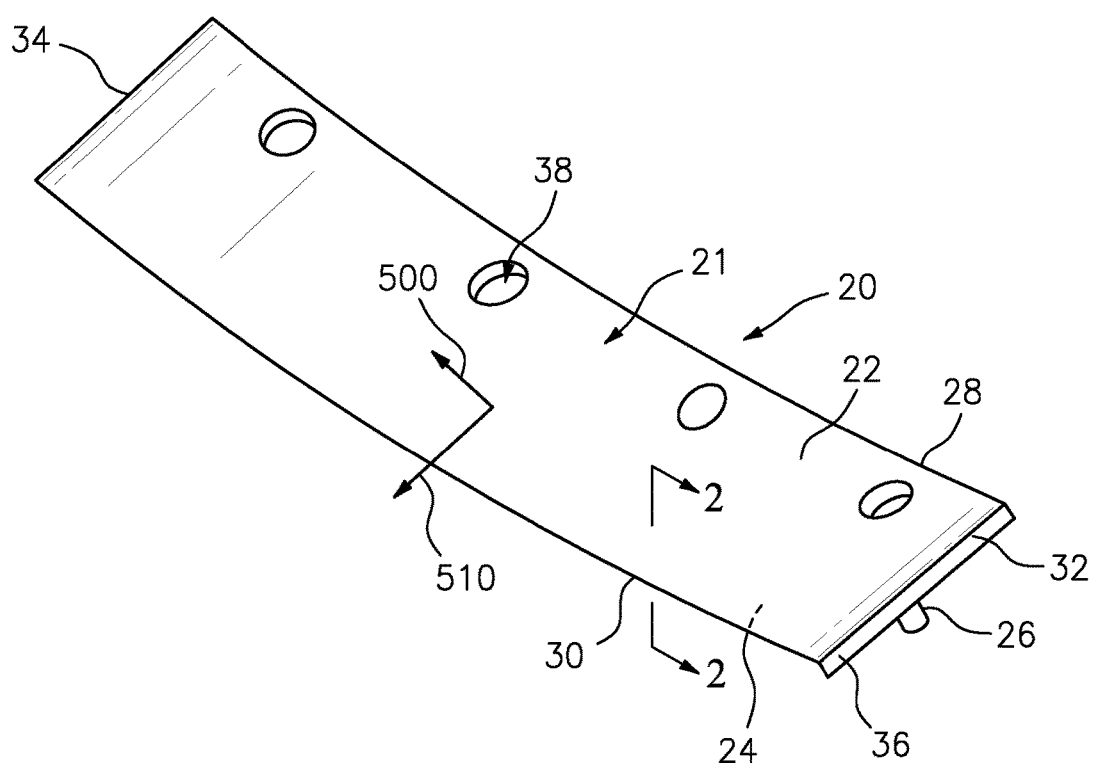
FIG. 1 is a view of a combustor panel.

FIG. 1 shows a component as a combustor panel (e.g., a floatwall panel) 20 of a gas turbine engine, industrial gas turbine, or the like (not shown). The panel 20 may be formed having a body 21 shaped as a generally frustoconical segment having respective inboard and outboard surfaces 22 and 24. The exemplary inboard surface is thus a gaspath-facing surface formed as a frustoconical segment (with a surface normal shown as 500).

The exemplary panel is configured for use in an annular combustor circumscribing the engine centerline. In the exemplary panel, the inboard surface 22 forms an interior surface (i.e., facing the combustor interior) so that the panel is an outboard panel. For an inboard panel, the inboard surface would be the exterior surface. Accordingly, mounting features such as studs 26 extend from the outboard surface for securing the panel relative to the engine.

An exemplary annular combustor is formed by a number of concentric inner rings and outer rings of such panels. A plurality of such rings are arrayed end-to-end at both inner diameter (ID) and outer diameter (OD) boundaries. These rings may extend downstream from a bulkhead (also a ring of panels) mounting fuel injector nozzles, air swirlers, and the like. The panel rings may extend downstream to a guide vane ring at the inlet to the turbine section.

The exemplary panel body 21 further includes an upstream/leading edge 28, a downstream/trailing edge 30 and lateral edges 32 and 34. A flow direction 510 along each such panel may be generally from the upstream/leading edge 28 to the downstream/trailing edge 30. Along one or more of the edges or elsewhere, the panel may include rails or standoffs 36 extending from the exterior surface 24 for engaging a combustor shell (not shown). The exemplary panel includes a circumferential array of large apertures 38 for the introduction of process air. Smaller apertures (discussed below) may be provided for film cooling. Moreover, select panels may accommodate other openings for spark plug or igniter placement.

FIG. 2 shows cross-section 2-2, a metallic substrate 50 of the body 21 having an inboard surface 52 and an outboard surface 54. The exemplary inboard surface bears a ceramic thermal barrier coating 56, the exposed surface of which thus forms the inboard surface 22. FIG. 2 further shows cooling holes 60 extending through the substrate and coating. The cooling holes 60 may be identified as having portions 60-1 (the portion of the hole going through the metallic substrate) and 60-2 (through the coating), both portions also identifiable as holes. The exemplary holes 60-1 are circular in cross-section having a characteristic diameter $D_H$. The exemplary holes 60-1 are off-normal to the substrate surface 52 so as to have flow velocity vector components generally aligned with the gas-path direction of flow across the surface 22. The off-normal orientation of the hole 60-1 combined with artifacts of manufacture may cause the shape of the holes 60-2 to flare off of the circular cross-section of the hole 60-1.

Alternative holes may have simple or compound curvature (e.g., spiral) and may have divergent/flared outlets along the gaspath-facing surface.

In situations where the holes 60-1 preexist in the substrate prior to coating application, a braze method is used to avoid plugging or reduction of the effective flow area of the holes via coating application.

In an exemplary method of manufacture, the substrate 50 (FIG. 3) is initially manufactured without holes (e.g., via casting). Additional manufacture steps may include the attachment (press-fit, welding, or the like) of features such as mounting studs (although such elements may be added after hole formation discussed below). Exemplary casting is investment casting in an investment casting mold in an investment casting furnace. Exemplary substrate material is a high-temperature nickel-based or cobalt-based superalloy such as Mar-M-247, B1900, or CSMX-4. Exemplary liquidus temperatures are in the range of 1300 C to 1400 C, more particularly 1330 C to 1370 C. Exemplary casting is at a pour temperature in the range of 150 F+(83 C+) to alloy liquidus temperature, more broadly 150+/−50 F (83+/−28 C). Target alloy end-use temperatures are in the range of 1400 F to 2100 F (760 C to 1149 C), more narrowly 1800 F to 2000 F (982 C to 1093 C).

After casting, there may be various stages of cooldown or thermal processing which may occur in specific processing chambers. Upon removal from the casting furnace or other thermal processing chamber, post-casting preparation may include conventional acts such as cleaning casting flash/gating from components through conventional machining such as die grinders or hand saws.

Depending on the nature of the component, there may be finish machining to achieve tolerance dimensions, finish, or the like. This may include machining of the cooling holes 60-1 (FIG. 4) into the substrate. Exemplary hole machinings are percussive laser drilling or EDM processes. In other embodiments the holes could be integrally cast with the component through sacrificial mold material (e.g., casting cores).

The hole machining may be succeeded by one or more further thermal processing steps. In one example, hole machining is followed by a stress relief. Exemplary stress relief involves placement in a vacuum furnace at 1800 F (982 C), more broadly 1600-1950 F (871 C to 1066 C) for a duration of thirty minutes (more broadly 15-50 minutes). Exemplary vacuum furnace pressure is $<5\times10^{-4}$ mmHg. The exemplary stress relief may be effective to reduce residual thermal strains induced during casting of the component or machining of the holes.

Post-stress relief processing may include a rapid cooling such as to room temperature (e.g., 70 F (21 C)) using forced air convection. This may be achieved by transferring the substrate to an atmospheric cooling chamber where forced air convection cooling may be performed on a chilling table (a porous table that has a fan drawing air through it). The rapid cooling may be effective to reduce any new thermal strains and to capture the solid-state phase stability of the material.

The cooled substrate (e.g., after removal from the atmospheric cooling chamber) may receive the braze material 70 (FIG. 5) for forming braze plugs to mask the holes during coating. The braze material may be placed in or near the holes. In particular, it may be placed on the substrate surface to be coated (e.g., 52 in this example) and may leave the opposite surface (e.g., 54 in this example) clear. An exemplary braze material is applied as a braze paste.

Once heated above the melting temperature of the braze material, surface tension or capillary action of the melted braze material may tend to draw the molten braze material into the hole in the substrate. Thus, it is not necessary, for example, to inject into the hole. Additionally, by applying the braze material aside the hole and leaving the hole unblocked, the chances of (via handling, drawing vacuum, or heating) blowing off braze material are reduced. For example, if braze material in the hole trapped gas, the vaporization of the gas might splatter braze material.

Exemplary application may be manual such as with a spatula or syringe or automated such as a robotic feeder. As is discussed above, the exemplary application of braze paste does not plug the hole but rater is adjacent the opening to the surface and may circumscribe the hole.

Exemplary as-applied braze material is a braze paste comprising particles of braze alloy in a non-metallic binder. Exemplary braze alloy is an Au—Cu alloy. This tends to be non-reactive to nickel-based and cobalt-based superalloy substrates. Exemplary alloy has no more than 5% all other elements total, more particularly no more than 2% or no more than 1%. Exemplary Au/Cu weight ratio in the alloy is about 62/38, more broadly between 67/33 and 56/44 inclusive. These ratios offer beneficial performance in having a liquidus: sufficiently above the coating application temperatures to avoid remelt; and sufficiently below not just substrate liquidus, but substrate stress relief temperatures. This serves to allow mechanical dimensional coherence during these processes if rework or additional stress relief is necessary.

Exemplary alloy is powdered (e.g., to −325 mesh) prior to mixing with the binder.

Exemplary binder is a gel, more particularly, a water-based gel. Exemplary binder is sold by Vitta Corporation of Bethel, Conn. under the trademark Vitta Braz-Binder Gel. Exemplary binder forms 8% to 25% by weight of the braze paste as-applied.

To melt the braze material, the substrate bearing braze paste may be transferred to a braze furnace such as a vacuum furnace. An exemplary furnace is at a temperature of 1500 F to 1600 F (816 C to 871 C), more broadly (795 C to 895 C). Exemplary vacuum furnace pressure is $<5\times10^{-4}$ mmHg with $O_2$ content <0.2 ppm. Exemplary furnace exposure is for thirty minutes (more broadly 20-40 minutes). The vacuum and heating will volatize off the binder and melt the braze alloy. If not already in the hole 60-1, capillary action will draw the molten alloy 80 (FIG. 6) into the holes leaving surfaces or meniscus 80, 82 at either end of the hole or side of the substrate.

After melting of the braze alloy, the substrate may be quenched, solidifying the braze alloy to form a plug 90 (FIG. 7). An exemplary quench is a rapid quench to room temperature (e.g., 70 F (21 C)) using forced air convection on a cooling table or in a cooling chamber.

The amount of braze material will influence plug shape. In one example, there is a sufficiency of braze material so as to more than fill the holes 60-1 (e.g., leaving a convex meniscus slightly proud of the surrounding substrate surface). If less material is provided there may be a concave meniscus slightly recessed from the adjacent rim of the hole. If the plug is proud of the surface, there may optionally be a further machining (e.g., a sanding operation) to reduce or eliminate the protrusion. In other embodiments proud material could be formed to provide a negative shape for cooling hole shapes to be defined within the coating 56.

In alternative embodiments, the braze material may be injected into the holes and excess material may be removed (e.g., manually scraped away with a soft tool and cleaned with a water moistened towel). In that example, by wiping away material, there will be an insufficiency to fully fill the holes, leaving the aforementioned concave meniscus.

After plug solidification, the coating may be applied. In the illustrated example, a ceramic coating is applied directly to the substrate surface. Such as via plasma spray or electron beam physical vapor deposition (EBPVD) in a corresponding chamber. Other embodiments could use a coating system with a bondcoat applied beforehand such as via low-pressure plasma sprays or EBPVD. For plasma spray application, maximum local substrate surface temperatures are typically <1000 F (<538 C). For EBPVD application, maximum local substrate surface temperatures are typically <1300 F (<704 C). Both are below the braze alloy remelt temperature.

Exemplary ceramic coatings are stabilized zirconias such as yttria-stabilized zirconia (YSZ) and/or gadolinia-stabilized zirconia (GSZ).

The ceramic coating may tend to preferentially deposit on the substrate and not the surface 92 of the plug. An opposite plug surface is labeled 94. The preferential deposition may leave a gap 100 or substantial thinning in the coating over the exposed plug surface. FIG. 7 shows a gap 100 with slight bridging 102 onto the exposed plug surface. The preferential deposition may be due to any of several factors. The surface 92 of the plug may be relatively smooth which is particularly inhospitable to plasma spray mechanical bonding. Chemical properties of the surface 92 may be inhospitable to EBPVD bonding.

After coating, the coated substrate may be allowed to cool or actively cooled (e.g., to room temperature on a cooling table or in a cooling chamber).

After coating and optional cooling, there is a subsequent remelt and evacuation of the braze alloy. To assist in evacuation, vibration and/or air (or other gas) flow may be used. The component may be mounted to either an airflow fixture or vibration fixture within a vacuum furnace (e.g., at a pressure $<5\times10^{-4}$ mmHg). The component is heated to a temperature effective to remelt the braze alloy. Exemplary temperature is between 1500 F to 1600 F (816 C to 871 C), more broadly (795 C to 895 C). Surface tension/wetting may hold the molten plug in place. To induce evacuation, once steady-state temperature is reached, airflow to and/or vibration of the component may commence and be maintained for a set time (e.g., 30 minutes, more broadly 20 minutes to 50 minutes). The duration of these processes allows incidental coating over these regions to loosen and traverse out of the holes. This also allows for time for the braze material to travel out of the holes. At a certain point the amount of braze material left is surface bound and it takes a longer duration of evacuation to get it off the surface.

An exemplary vibrator is a shaker table with a frequency of 10-20 Hz; this may be done while maintaining vacuum.

To use an airflow, the furnace may be one that could be slowly pressurized after an initial vacuum heating for the remelt. Then a forced air flow may be directed through the component either through aerodynamic stagnation on one side or through direct supply through a hard-contact plenum. A hard-contact plenum is a chamber which is pressurized and has an aperture which has a contact surface on which to seat the target component such that the cooling features of the component are the only exits for the plenum to evacuate through. An exemplary hard-contact plenum may introduce air from the side of the substrate opposite the coating. This may be desirable to avoid driving coating into the holes but also to avoid damaging the coating by fixturing the component along uncoated surface portions.

The vibration, and more particularly airflow, if present, may rupture any webs or bridging of the coating material across the hole openings.

There may be a subsequent solution heat treat. This may be effective to resolve or disperse any substrate material that could have segregated during prior processing. The solution heat treat may be performed in the same furnace as the remelt without intervening cooldown. An exemplary solution heat treat increases component temperature to 2150 F (1177 C), more broadly 2000 F to 2300 F (1093 C to 1260 C) and hold for one hour, more broadly 0.5 hour to 4 hours. During this time, the braze alloy may be molten at the bottom of the furnace, or if there is a gradient in the furnace it might have a chance to solidify at the bottom of the furnace.

In some implementations, at the end of solution heat treatment one may repeat airflow and or vibration (e.g., for 30 minutes, more broadly, 20 to 40 minutes) to evacuate any residual braze or over-hung coating not liberated during the initial melt. The time between could also allow coalescing of smaller braze material droplets.

Finally, there may be a cooldown. A rapid cooldown may be to room temperature using forced air convection. This may be effective to ensure substrate material homogeneity, minimization of discontinuities and impurities, and controls desired solid-state phases.

As is noted above, cast-in-place holes are alternatives to the machined holes. Additionally, additive manufacturing may be used as an alternative to casting. Again, the holes may be machined into the additively manufactured substrate or may be formed as part of the additive manufacturing process.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline component configuration of manufacturing process, details of such baseline may influence details of particular implementations. For example, different considerations may attend blades or vanes wherein surface complexity provides a broad distribution of cooling hole position and orientation. Use of pressurized air introduced through the cooling inlets of such components may be a particularly relevant way of evacuating the remelted braze alloy. Accordingly, other embodiments are within the scope of the following claims.

What is claimed is:

1. A method for applying a coating to a substrate having a plurality of holes, the method comprising:
   applying a braze material to a substrate having a plurality of holes, the braze material being an Au—Cu braze material unreactive to the substrate and the braze material comprising a braze paste, the braze paste comprising a water-based gel binder;
   heating the substrate to melt the braze material to form a melt;
   cooling the substrate to solidify the melt to form plugs in the respective holes;
   applying a coating to the substrate; and
   further heating the substrate to melt the plugs.

2. The method of claim 1 wherein:
the braze paste comprises particles of an alloy having a by weight composition of Au, Cu, and no more than 5% all other elements total, if any.

3. The method of claim 2 wherein:
a ratio of Au to Cu in said alloy is between 67/33 and 56/44.

4. The method of claim 2 wherein:
said particles of said alloy form at least 95% of alloy in the braze paste.

5. The method of claim 1 wherein:
said water-based gel binder forms 8% to 25% by weight of the braze paste.

6. The method of claim 1 further comprising:
machining the holes.

7. The method of claim 1 further comprising:
using pressurized gas to evacuate molten material of the plugs.

8. The method of claim 1 further comprising:
vibrating to evacuate molten material of the plugs.

9. The method of claim 1 wherein:
the coating comprises a ceramic layer.

10. The method of claim 1 wherein:
the substrate is a nickel-based superalloy.

11. The method of claim 1 wherein:
the substrate is a combustor panel substrate having a body formed as a frustoconical segment.

12. The method of claim 11 wherein:
the holes are along the body.

* * * * *